United States Patent
Clemente

Patent Number: 6,127,746
Date of Patent: *Oct. 3, 2000

[54] METHOD OF CONTROLLING THE SWITCHING DI/DT AND DV/DT OF A MOS-GATED POWER TRANSISTOR

[75] Inventor: Stefano Clemente, Rolling Hills Estate, Calif.

[73] Assignee: International Rectifier Corp., El Segundo, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/946,870

[22] Filed: Oct. 8, 1997

Related U.S. Application Data

[60] Provisional application No. 60/028,840, Oct. 21, 1996.

[51] Int. Cl.⁷ ............................................. H03K 17/00
[52] U.S. Cl. .................... 307/131; 326/83; 327/108; 327/365; 327/380; 327/381; 327/419; 327/440
[58] Field of Search ............................. 307/130, 131; 327/108, 380, 381, 440, 419; 326/83

[56] References Cited

U.S. PATENT DOCUMENTS

| | | | |
|---|---|---|---|
| 4,504,779 | 3/1985 | Haman | 327/108 |
| 4,663,547 | 5/1987 | Baliga et al. | 327/440 |
| 4,947,063 | 8/1990 | O'Shaughnessy et al. | |
| 4,958,086 | 9/1990 | Wang et al. | 327/380 |
| 4,972,101 | 11/1990 | Partovi et al. | 326/83 |
| 5,194,760 | 3/1993 | Braun et al. | |
| 5,204,563 | 4/1993 | Jason | 327/108 |
| 5,463,344 | 10/1995 | Temple | 327/380 |

FOREIGN PATENT DOCUMENTS

| | | |
|---|---|---|
| 0493185 | of 1991 | European Pat. Off. |
| 0620644 | of 1993 | European Pat. Off. |
| 0645889 | of 1993 | European Pat. Off. |
| 2140996 | of 1984 | United Kingdom |
| 2257854 | of 1991 | United Kingdom |

OTHER PUBLICATIONS

International Rectifier Application Note AN–944: "A New Gate Charge Factor Leads to Easy Drive Design for Power MOSFET Circuits" by B.R. Pelly—Chapter 7.

IGBT Fault Current Limiting Circuit by R. Chokhawala and G. Castino, IR IGBT Data Book–3 pp. E–127–E–134.

*Primary Examiner*—Albert W. Paladini
*Attorney, Agent, or Firm*—Ostrolenk, Faber, Gerb & Soffen, LLP

[57] ABSTRACT

The switching di/dt and switching dv/dt of a MOS gate controlled ("MOS-gated") power device are controlled by respectively controlling the voltage and current waveforms. Open loop control of the turn-on of the MOS-gated device is provided by coupling a common terminal of a current generator circuit, which provides a current to the gate of the MOS device, to a first resistor for controlling the switching dv/dt. At the detection of a negative dv/dt, the common terminal of the current generator circuit is then coupled to a second resistor for controlling the switching di/dt. The first and second resistors are, in turn, coupled to the source terminal fo the MOS-gated device. An analogous operation provides turn-off control of the MOS-gated power device. Closed loop control is also provided by measuring the switching dv/dt and the switching di/dt which are then fed back to the circuit to control the current supplied to the gate of the MOS-gated device. The switching di/dt can be measured by measuring the voltage difference across the length of a calibrated wire bond having a predetermined length and diameter.

22 Claims, 6 Drawing Sheets

METHOD OF CONTROLLING THE SWITCHING DI/DT AND DV/DT OF A MOS-GATED POWER TRANSISTOR

RELATED APPLICATIONS

This application claims the priority of Provisional Application Ser. No. 60/028,840 filed Oct. 21, 1996.

BACKGROUND OF THE INVENTION

The present invention is directed to clamped inductive load circuits and, more particularly, to clamped inductive load circuits in which a MOS gate controlled ("MOS-gated") power transistor is switched on and off wherein the circuitry is integrated into a silicon chip.

Power transistor devices, while turning on or off, divert the flow of current and reconfigure the voltage distribution of a power conversion circuit. MOS-gated transistors, such as MOSFETs or IGBTs, perform this operation within a fraction of a microsecond at very rapid voltage and current slew rates. The fast switching of their waveforms are desirable for reducing switching losses and for increasing operating frequency but also have the adverse effect of generating unwanted electromagnetic interference (EMI) in the surrounding environment. In environments where EMI susceptibility is critical or where EMI interference is regulated by legislation, it is desirable to independently adjust the voltage and current waveforms to meet these requirements without unnecessarily increasing the switching losses.

Figure 1A:
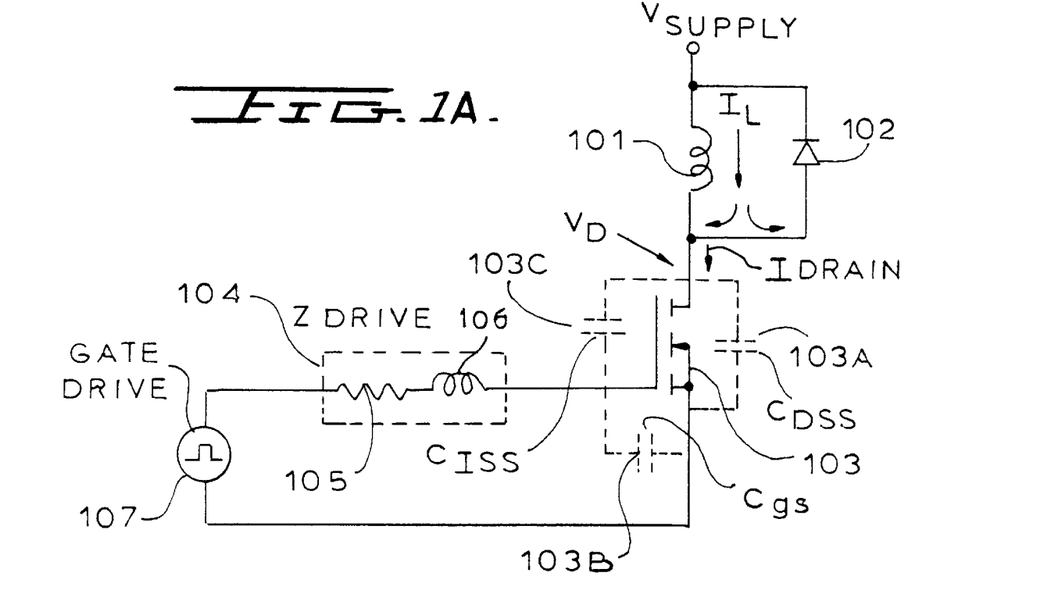
FIG. 1A is a schematic diagram showing a known clamped inductive load circuit.

A clamped inductive load circuit is a power circuit whose load inductance prevents its current from being brought to zero within a cycle of the operating frequency. Most power conversion circuits are clamped inductive load circuits. FIG. 1A shows a simplified clamped inductive load circuit in which a MOSFET 103 goes in and out of conduction. The switching transient can be divided into a number of intervals, as shown in FIG. 1B and 1C, wherein the current rise interval and the voltage fall interval follow each other and can be controlled independently.

Figure 1B:
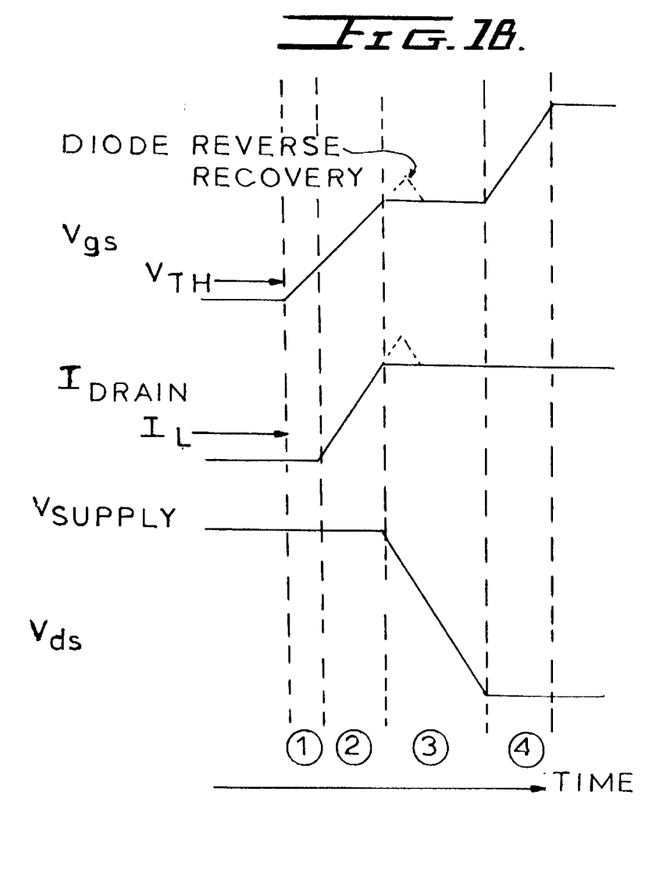
FIG. 1B illustrates the turn-on waveforms of the power transistor of the circuit of FIG. 1A.
Figure 1C:
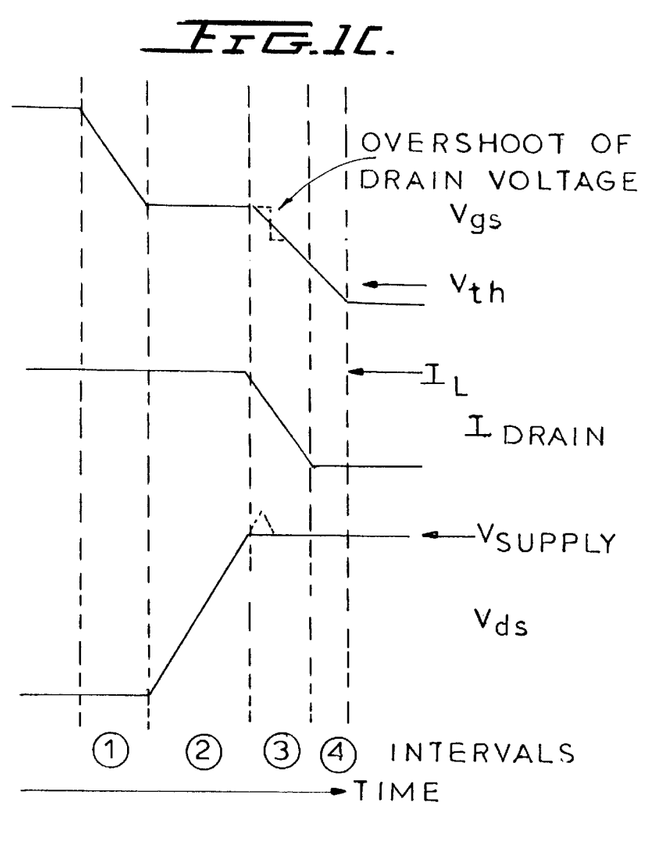
FIG. 1C illustrates the turn-off waveforms of the power transistor of the circuit of FIG. 1A.

While the gate drive circuit feeds current to the gate, the gate voltage rises in the manner of a capacitor being charged, shown as interval 1 in FIG. 1B. When the gate voltage $V_{gs}$ reaches the threshold voltage of the MOSFET 103, the drain current $I_{DRAIN}$ increases and diverts current away from the freewheeling diode 102, as shown in interval 2. As long as the diode 102 carries current, the drain voltage is clamped to the supply voltage. When all the current (plus reverse recovery current, if any) is transferred from the diode to the MOSFET, the drain voltage falls to its final, fully enhanced, value. Hence, the drain voltage only begins to fall after the drain current rise is completed which allows separate control of both waveforms. This process is described in detail in International Rectifier Application note AN-944: "A New Gate Charge Factor Leads to Easy Drive Design for Power MOSFET Circuits".

During the drain current rise, shown in interval 2 of FIG. 1B, the drain current is proportional to the gate voltage, and the rate of rise of the gate voltage determines the switching di/dt. Because of the gate capacitance of MOSFET 103 (capacitor 103B), the current rise time can be controlled by controlling the quantity of current supplied to the gate. The reverse recovery of the diode prolongs interval 2.

During the drain voltage fall, shown as interval 3, the output capacitor 103A and the reverse transfer capacitor 103C of MOSFET 103 discharge. The rate at which these two capacitances are discharged determine the rate at which the drain voltage falls. While the output capacitor discharges rapidly through the channel resistance, the reverse transfer capacitor only discharges through the gate drive circuit. The flat portion of the gate voltage curve shown in interval 3 indicates that the current supplied to the gate terminal is almost completely delivered to the reverse transfer capacitor whereas the voltage across the input capacitor does not change. Thus, the value of the dv/dt here can be controlled by supplying an appropriate amount of current to the gate.

At the end of interval 3 in FIG. 1B, the switching transient is completed and any additional current supplied to the gate does not change the drain voltage or drain current, as shown in interval 4 of FIG. 1B.

The turn-off process is generally a mirror image of the turn-on process. First, the gate voltage $V_{gs}$ is reduced to a value that barely maintains the drain current, as depicted in interval 1 of FIG. 1C. Then, the voltage across the device rises, while the drain current is constant, as shown in interval 2 of FIG 1C. When the voltage across the MOSFET 103 exceeds the supply voltage by a value equal to the diode voltage drop, the diode starts conducting and load current is transferred from the MOSFET through the diode, as shown in interval 3 of FIG 1C. As the device turns on, the rise in drain voltage and the fall in drain current occur sequentially. The drain voltage rise time is thus substantially determined by the charging of the reverse transfer capacitor through the gate circuit impedance 104, and the subsequent drain current fall time is determined by the discharging of the input capacitance. A voltage overshoot is often present at the drain when interval 2 ends which prolongs this interval.

MOS-gated devices with a significant minority carrier component of current, such as IGBTs, MCTs and other derivatives, behave somewhat differently at turn-off because their current fall time is influenced by the recombination of the minority carriers. Similarly, the current rise time during their turn-on is influenced by the carrier injection efficiency.

Figure 2A:
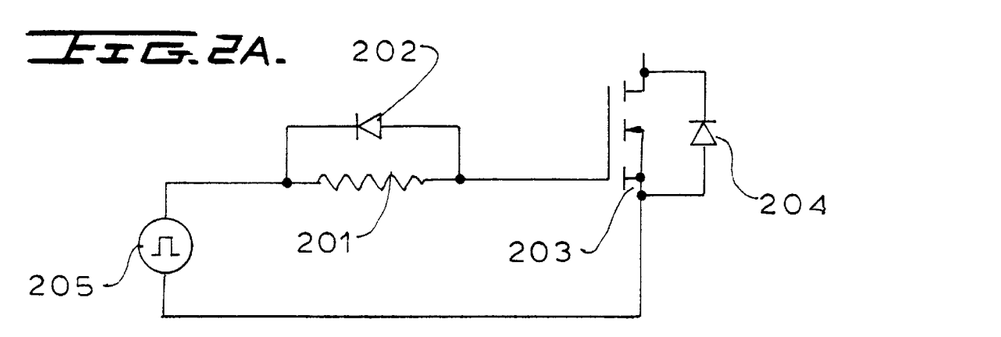
FIGS. 2A and 2B show known circuits for slowing down the turn-on and turn-off of the power transistor of the circuit of FIG. 1A.

Typically, resistors are incorporated into the gate drive circuit to slow down the switching. An additional resistor 201 and diode 202, as shown in FIG. 2A, may be added to the circuit of FIG. 1A to change the wave form at turn-on and at turn-off and, particularly, to limit the reverse recovery current from the diode. Because different respective current values are needed to obtain the desired di/dt and dv/dt, the selection of the added resistor requires a compromise between obtaining the desired di/dt and obtaining the desired dv/dt. The added resistors in the gate drive circuit also make the circuit more prone to dv/dt induced turn-on, namely an unwanted conduction caused by a transient current in the drain that is coupled to the gate through the reverse transfer capacitance.

By contrast, the diode 202 shunts the resistor 201 shown in FIG. 2A and bypasses the resistor, thus providing a low impedance path for fast transients injected from the drain, but eliminates the possibility of providing turn-off waveshaping.

Figure 2B:
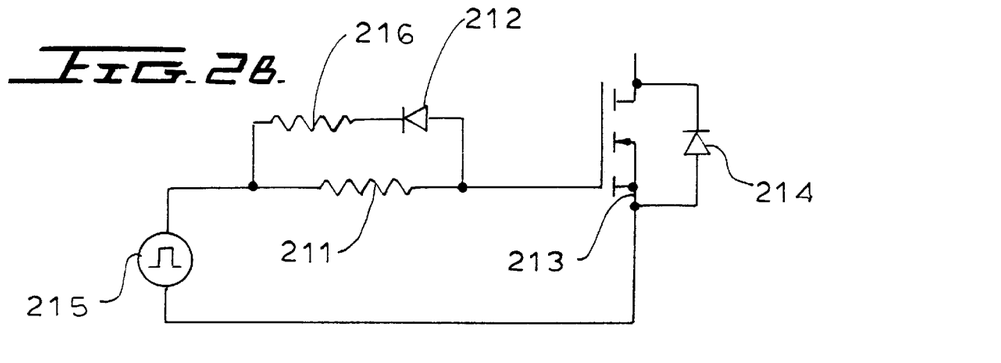

As shown in FIG. 2B, resistor 211 and diode 212 may be used as in FIG. 2a for resistor 201 and diode 202, respectively, but a resistor 216 is further connected in series with diode 212 for further control.

Figure 3:
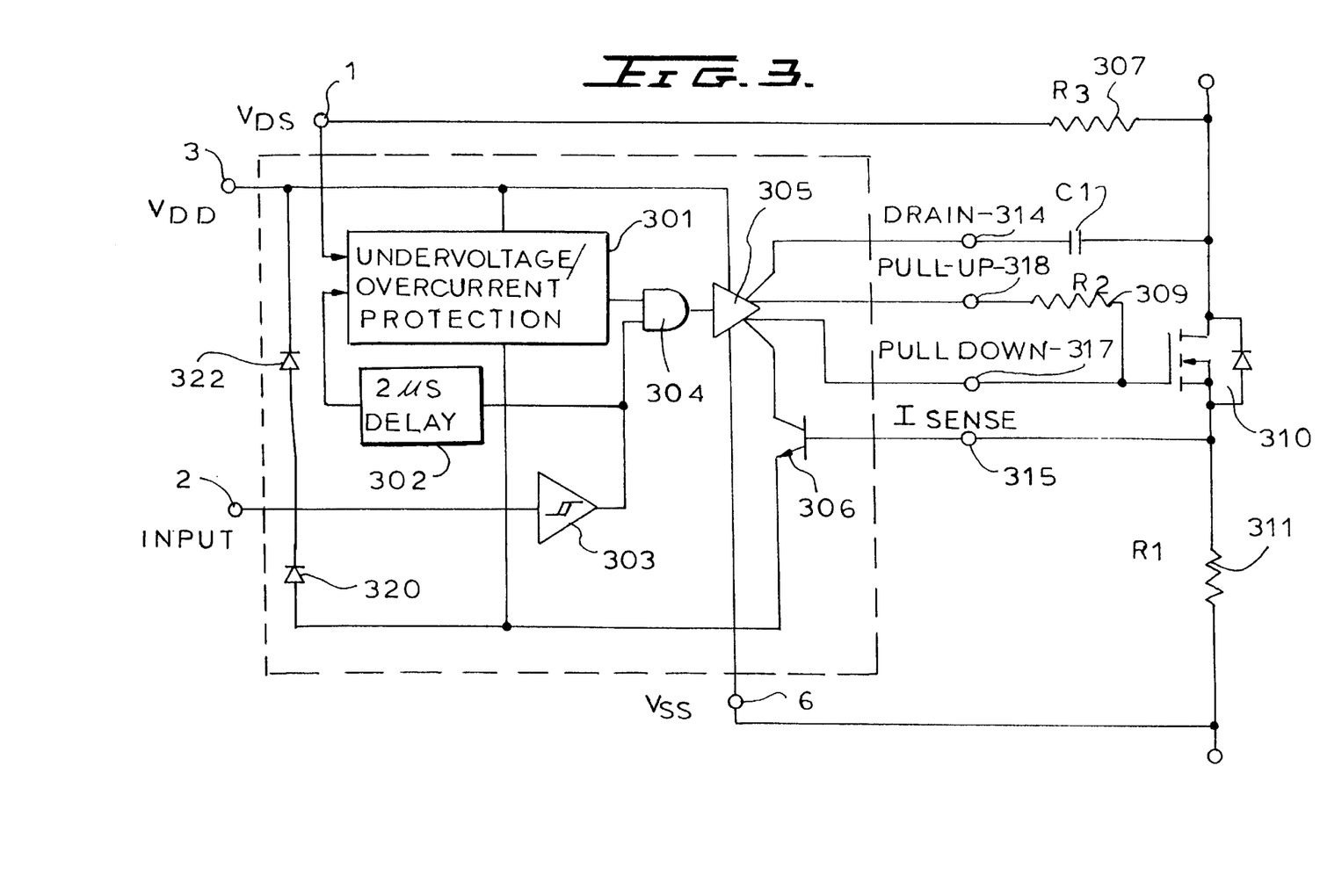
FIG. 3 is a functional block diagram showing a known circuit having closed loop dv/dt sensing and overcurrent protection.

Control of dv/dt is attempted by Siliconix in the a gate driver IC Si9910 sold by Siliconix Corporation. Thus, as shown in FIG. 3, the voltage slew rate is sensed using a small capacitance 308 connected to the drain of power device 310. The sensed dv/dt is controlled by a feedback loop. The circuit however, uses a linear loop which is prone to oscillations. The chip also provides control of the peak current, but di/dt in the power device is controlled only when appropriate feedback is provided.

Additionally, the short-circuit protection scheme used in the circuit of FIG. 3 typically turns off the power transistor in two steps to avoid voltage overshoots frequently associated with fast turn-off of a large current. Thus, the gate voltage is initially reduced to approximately half its initial value and then is totally shut off. This approach allows a power device to be turned off slowly, rather than in two steps, from a short circuit condition. The circuit, however, does not control di/dt during switching because it is intended to protect the device from the overvoltage transient associated with the turn-off of a fault, such as short circuit, and is triggered by the fault and is otherwise inoperative during normal operation. Such methods are also described in "IGBT Fault Current Limiting Circuit" by R. Chokhawala and G. Castino, IR IGBT Data Book IGBT-3, page E-127.

It therefore is desirable to provide a circuit which both drives a MOS-gated power transistor device and controls both the switching di/dt and the switching dv/dt.

SUMMARY OF THE INVENTION

The present invention controls the switching di/dt and dv/dt of a MOS gate controlled power transistor by respectively controlling the voltage and current wavefronts of the waveform. Both open loop and closed loop control are available. The di/dt is sensed in a lossless and inexpensive manner.

According to an aspect of the invention, open loop control of the switching di/dt and switching dv/dt at turn-on the MOS-gated device is provided by coupling a common terminal of a current generator circuit, which provides a current to the gate of the MOS device, to a first resistor for controlling the di/dt. When a negative dv/dt is detected, the common terminal of the current generator circuit is decoupled from the first resistor and is then coupled to a second resistor for controlling the switching dv/dt. The first and second resistors are, in turn, coupled to the source terminal of the MOS-gated device. An analogous operation using this circuit provides turn-off control of the switching dv/dt and the switching di/dt of the MOS-gated power device.

According to another aspect of the invention, closed loop control is provided by further measuring the switching dv/dt and the switching di/dt which are then fed back to the circuit to control the current supplied to the gate of the MOS-gated device.

According to a further novel aspect of the invention, the value of the switching di/dt is determined by measuring the voltage difference across the length of a calibrated wire bond having a predetermined length and diameter.

Other features and advantages of the present invention will apparent from the following description of the invention which refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

Figure 4A:
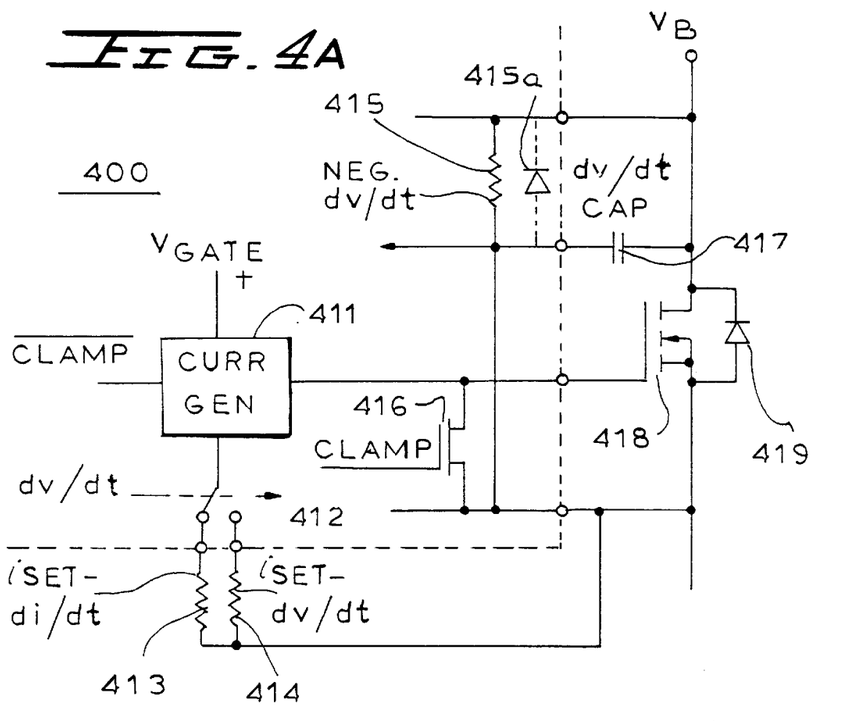
FIG. 4A illustrates a circuit arrangement for controlling the switching di/dt and dv/dt according to an aspect of the present invention.

Referring first to FIG. 4A, there is shown a circuit according to an aspect of the invention in which open loop control of the current and voltage wavefronts is provided. Here, a gate driver circuit 400, which may be an IC, controls the gate of power MOSFET 418 which, in turn, drives a load circuit (not shown). A diode 419 is connected in parallel with the MOSFET 418. Though a power MOSFET 418 is shown, the invention is also applicable to other MOS gate controlled devices such as IGBTs.

The gate driver circuit 400 includes a current generator circuit 411 which receives a gate drive signal $V_{GATE}$ and supplies a gate drive current to the gate of MOSFET 418. The current generator circuit 411 charges or discharges the gate of the MOSFET 418 using one of two possible values of gate drive current which are determined by, in this example, di/dt control resistor 413 and dv/dt control resistor 414 which control the current and voltage waveforms, respectively. Specifically, the common terminal of the current generating circuit 411 is connected to a switch circuit which connects the common terminal of the current generating circuit 411 to one of the resistors 413 and 414 which are, in turn, connected to the source terminal of the MOSFET 418. A known switching circuit may be used here.

Initially, after the power transistor 418 has been turned off in a previous switching cycle and after the turn-off transient has passed, a low impedance short between the gate and the source of MOSFET 418 is provided by turning on a hard clamp transistor 416 which rapidly discharges the gate-to-source capacitance. The subsequent switching transitions from one operating mode to the other are described below.

The turn-on sequence of the circuit is as follows:

First, the hard clamp is released by turning off MOSFET 416. Preferably, the MOSFET 416 is controlled by a D-type flip-flop 420, shown in FIG. 5A, which controls the clamp MOSFET 416 as a function of the gate drive signal $V_{GATE}$.

Figure 4B:
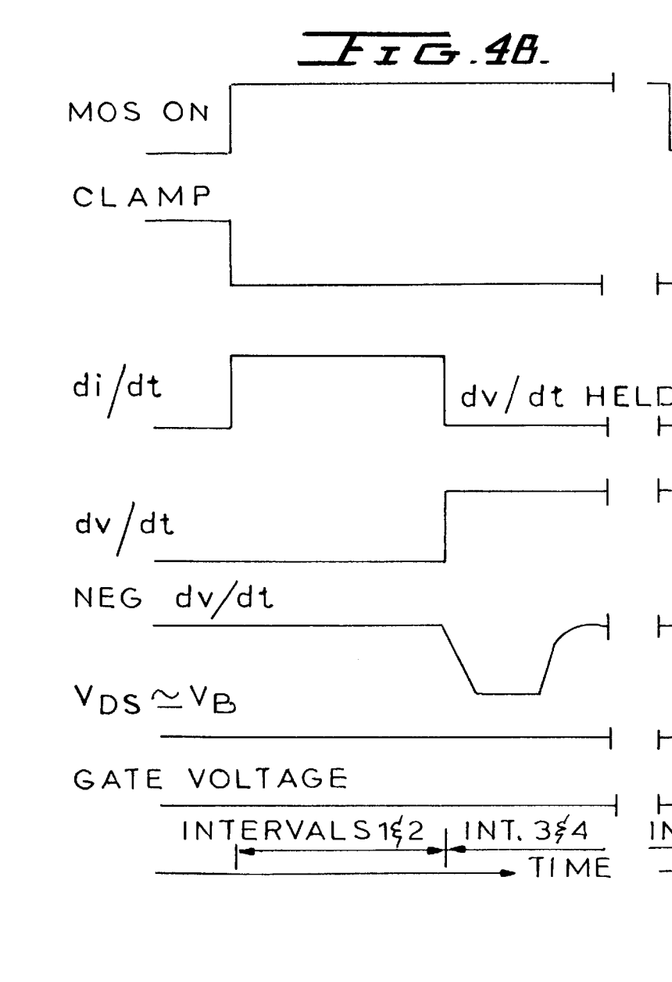
FIG. 4B shows the turn-on waveforms of the power transistor of the circuit of FIG. 4A.

The current generating circuit 411 is then connected to the external di/dt control resistor 413. A first gate drive current, whose value is determined by the value of the di/dt control resistor 413, is supplied to the gate of MOSFET 418 from the current generator circuit 411. The desired current value is maintained over the operating temperature range as is compliance of the gate drive supply, as shown as intervals 1 and 2 in FIG. 4B. During this interval, the gate-to-source voltage and drain current ramp up to their maximum values in a manner similar to that shown in FIG. 1B but with the di/dt being controlled by resistor 413.

Once the gate-to-source voltage and drain current reach their maximum values, the supply voltage begins to fall. The resulting negative dv/dt is detected at resistor 415 and capacitor 417 and triggers the output of a second value of the gate drive current by the current generator circuit 411 for providing dv/dt control, shown at intervals 3 and 4. The new value of the gate drive current is set by switching the terminal of circuit 411 from di/dt control resistor 413 to dv/dt control resistor 414.

Figures 5A, 5B:
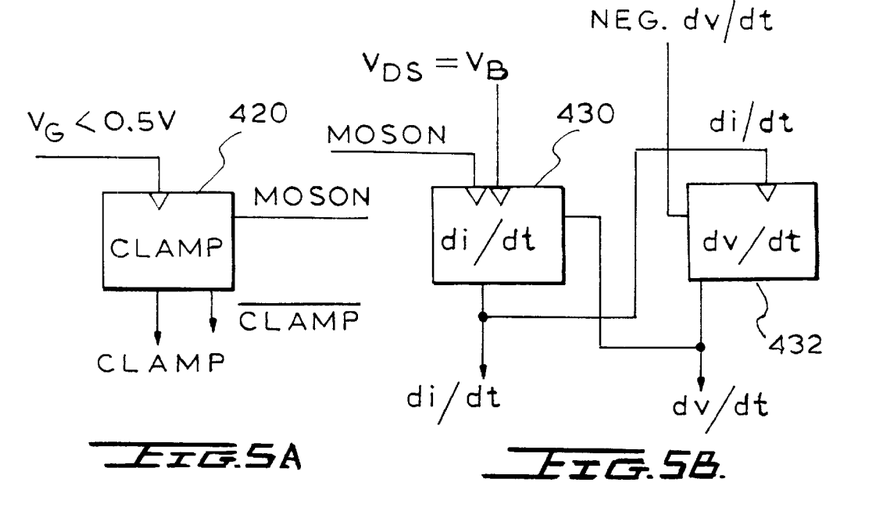
FIG. 5A shows an example of an implementation of the clamp of the circuit of FIG. 4A.
FIG. 5B shows an example of an implementation of the detection and switching circuit of the circuit of FIG. 4A.

Preferably, the negative dv/dt is detected using a negative dv/dt detecting capacitor 417 and resistor 415, which may be coupled to a diode 415a, which supply a negative dv/dt signal to an arrangement of D-type flip-flops 430 and 432, shown in FIG. 5B. The flip-flops 430 and 432 supply control signals which control the switching between resistors 413 and 414.

The second current controlled by resistor 414 is turned off when the voltage supplied by the current generator 411 reaches the value of the gate supply voltage, namely at the limit of compliance of current generator, or at some other suitable predefined limit.

Advantageously, the circuit shown in FIG. 4A includes no feedback loops and operates without instability. The circuit also operates in a predetermined gate drive current mode in each of the intervals of FIGS 4B and 4C. Though the values of the preset resistances 413 and 414 are dependent upon the specific MOSFET device used and the load circuit being driven, the method is generally applicable to other load circuits. The transition from one mode to the next mode is triggered by the respective di/dt and dv/dt events of the circuit.

Figure 4C:
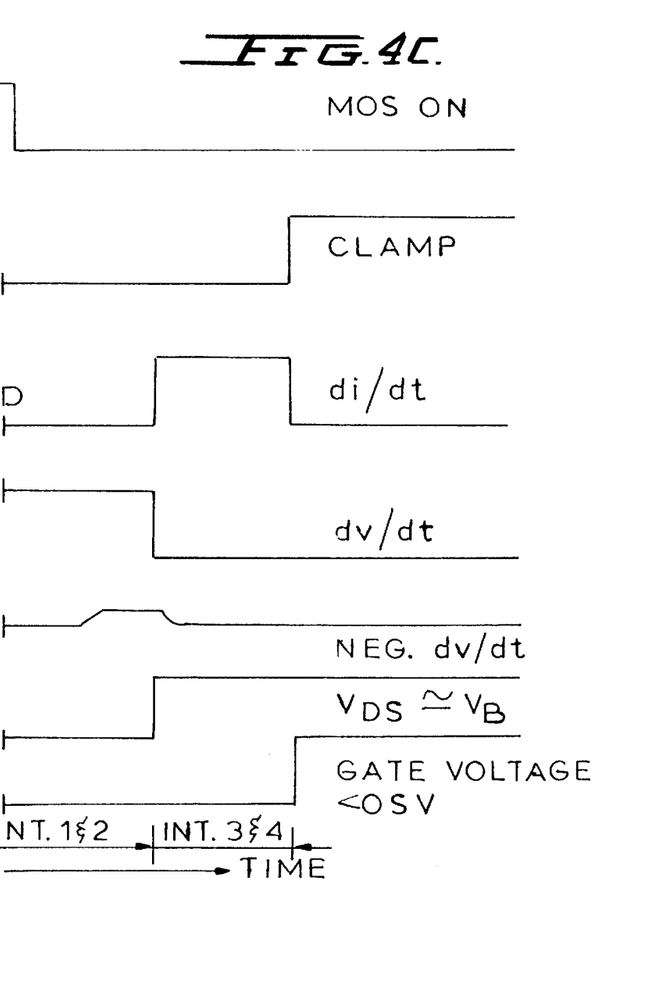
FIG. 4C shows the turn-off waveforms of the circuit of FIG. 4A.

The turn-off sequence (FIG. 4C) is now described as follows:

First, the gate of MOSFET 418 is discharged at a rate determined by the dv/dt control resistor 414, shown as intervals 1 and 2 in FIG. 4C. Here, the drain-to-source voltage and the drain current behave in a manner similar to that of intervals 1 and 2 of FIG. 1C, but the dv/dt is controlled by resistor 414.

When the source-to-drain voltage across the power MOSFET 418 reaches the value of the supply voltage, the current output of the current generator 411 is changed to a second value by switching from external resistor 413 to external di/dt control resistor 413, as shown in intervals 3 and 4. During this interval, the di/dt of the drain current is controlled by the value of resistor 413.

Thereafter, when the gate voltage falls below the threshold voltage, the hard clamp transistor 416 is turned on.

In the above example, it is assumed that the values of di/dt and the dv/dt are the same at turn-on and at turn-off. However, different values may alternatively be assumed for the turn-on and turn-off di/dt, if necessary, to limit the reverse recovery of the diode.

It should also be noted that the current generator circuit 411 "sinks" the gate drive current during turn-off and sources the gate drive current during turn-on.

The invention is also applicable to providing closed loop control of the current and voltage waveforms, as described below Closed loop control of current or voltage wavefronts requires the measurement of the di/dt or dv/dt. Measuring dv/dt is relatively simple and can be carried out using the small capacitance 417 that is connected to the drain of MOSFET 418 as described above and shown in FIG. 4A. Measuring the di/dt, however, typically required a more complex and expensive arrangement. When the value of the device current is used to operate the circuit, the same current feedback signal can also be used to control the current rise and fall times, namely the di/dt. When this signal is not available and the addition of a current feedback is not justified, open loop methods are used in the manner described above.

Figure 6:
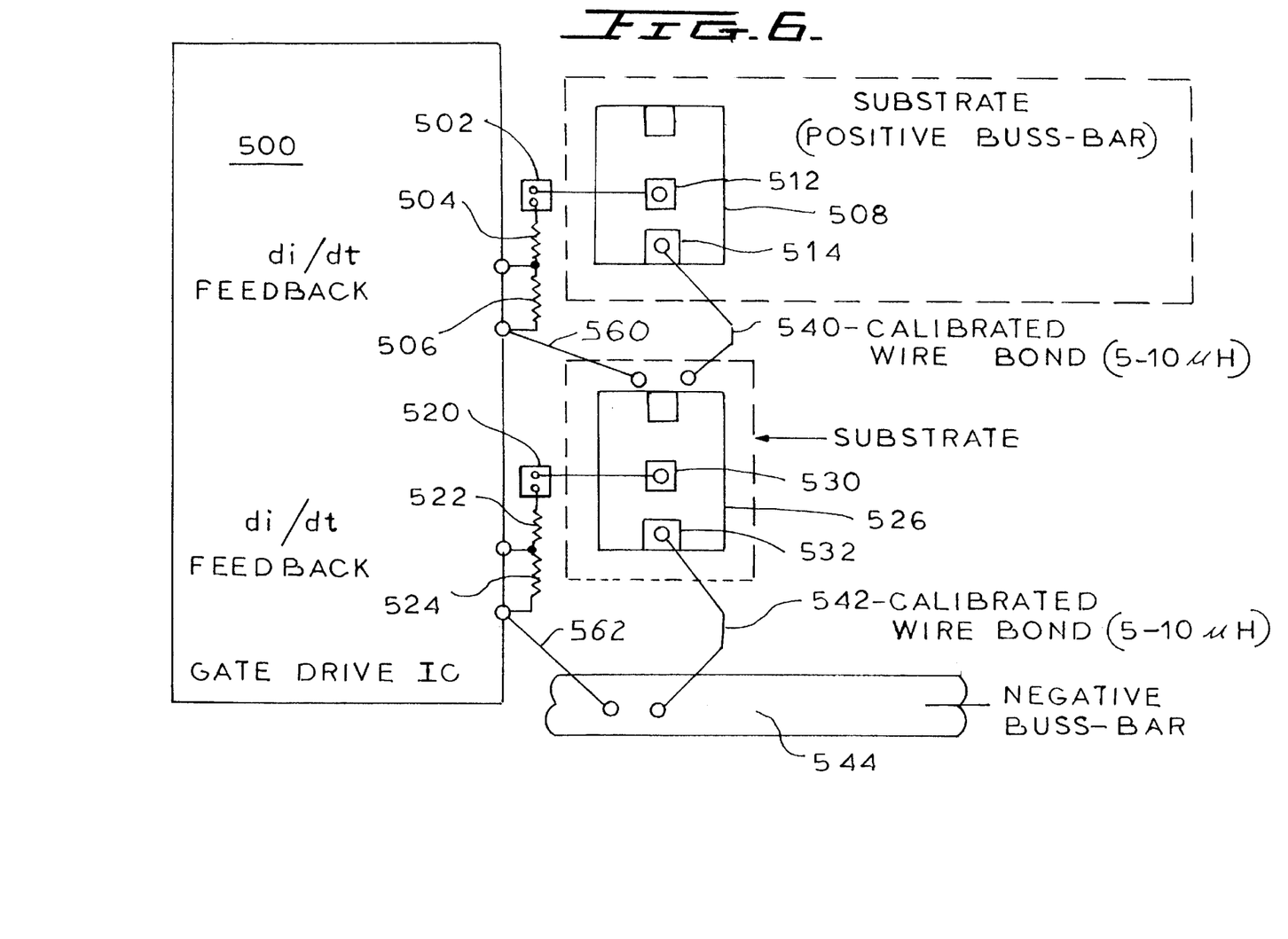
FIG. 6 illustrates a circuit arrangement for sensing switching di/dt according to another aspect of the invention in which a known value of a wire bond inductance is used.

According to another aspect of the invention, a simple lossless and inexpensive approach for sensing di/dt is provided by a hybrid circuit using calibrated wire bonds 540, 542, shown in FIG. 6. A bonding wire of predetermined length, shape and diameter has a known value of inductance and will develop a voltage difference across it that is proportional to the value of di/dt. Typically, the wire bond in a power hybrid device of the invention is 10 mm long and has an inductance of 5 to 10 nH, and when conducting a current having a di/dt of 0.1 to 0.5 A/ns, typically develops a 0.5 V to 5 V voltage difference across its length. This voltage difference can be supplied to a suitably designed di/dt feedback circuit in gate drive IC 500 to control the current supplied to the respective gates 512, 513 of devices 508 and 526, which may be MOS-gated devices, to attain the desired di/dt using known feedback methods.

The device 508 includes a terminal located on its bottom surface which is electrically connected to a substrate that serves as a positive bus. The device 508 also includes another terminal 514 which is connected by the calibrated wire bond 540 to another substrate upon which the bottom surface of the device 526 is mounted and which is connected to a terminal on the bottom surface of the device 526. Another terminal 532 of device 526 is electrically connected by the calibrated wire bond 542 to a negative bus 544.

The gate drive IC is connected to the gate 512 of device 508 through voltage divider resistors 504 and 506 at pad 502. One of the terminals to which resistor 506 is connected to the gate drive IC 500 is held at the same potential as the substrate upon which the device 526 is mounted by a wire bond 560. The gate drive IC 500 is also connected to the gate 530 of device 526 by voltage divider resistors 524 and 526 and is connected at pad 520. One of the terminals to which resistor 524 is connected is held at the negative bus potential by wire bond 562.

This same technique can be applied to a discrete device that is provided with a kelvin source or emitter connection. The voltage developed across the inductance of the source or emitter wire bond is sensed across the kelvin source wires, as shown in FIG. 6. Because the length of the bonding wire is controllable with very good accuracy by the manufacturing process, the di/dt can be measured with high accuracy.

The measured value of di/dt according to the invention can be used in conjunction with the previously described measured value of dv/dt to provide closed loop control using a circuit similar to that shown in FIG. 4A. However, the resistors 413 and 414 are replaced with an arrangement of operational amplifiers to control the switching di/dt and dv/dt as a function of the measured values.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A control circuit for controlling the switching di/dt and switching dv/dt of a MOS gate controlled power device, said MOS gate controlled device providing a supply voltage to a load circuit; said control circuit comprising:

a current generator circuit having an output coupled to a gate terminal of said MOS gate controlled device for supplying a current to said gate terminal;

a first resistor having a first resistance and being coupled to a source terminal of said MOS gate controlled device;

a second resistor having a second resistance and coupled to said source terminal; and a switching circuit for coupling a common terminal of said current generator circuit to a respective one of said first and second resistors for controlling the switching dv/dt and for coupling said common terminal to another of said first and second resistors for controlling the switching di/dt.

2. The circuit of claim 1, wherein said first resistance is chosen to provide di/dt control when said current generator circuit is coupled to said first resistor.

3. The circuit of claim 1, wherein that second resistance is chosen to provide dv/dt control when said current generator circuit is coupled to said second resistor.

4. The integrated circuit of claim 1, wherein said control circuit further includes a negative dv/dt detection circuit coupled to said switching circuit.

5. The circuit of claim 4, wherein said negative dv/dt detector circuit includes a capacitor.

6. The circuit of claim 4, wherein said negative dv/dt detector circuit includes a resistor.

7. The integrated circuit of claim 1, further including a di/dt measurement circuit coupled to said switching circuit.

8. The circuit of claim 7, wherein said di/dt measurement circuit includes a calibrated wire bond having a predetermined length and diameter.

9. The circuit of claim 1, further comprising a clamp circuit coupled between said gate terminal and a source terminal of said MOS gate controlled device.

10. The circuit of claim 9, wherein when said MOS gate controlled device is initially turned on, said clamp circuit is activated to provide a low impedance connection between said gate and source terminals of said MOS gate controlled device.

11. The circuit of claim 10, further comprising a clamp control circuit for controlling said clamp circuit as a function of an applied gate signal.

12. The circuit of claim 11, wherein said clamp control circuit includes a flip-flop circuit.

13. The circuit of claim 1, further comprising a switching circuit for controlling the coupling of said common terminal of said current generator circuit to said one of said resistors as a function of a detected negative dv/dt.

14. The circuit of claim 13, wherein said switching circuit includes at least one flip-flop circuit.

15. A method of controlling the switching di/dt and switching dv/dt of a MOS gate controlled device; said MOS gate controlled device controlling a supply voltage to a circuit; said method comprising the steps of:

providing a current generator circuit for supplying a current to a gate of said MOS gate controlled power device;

coupling a common terminal of said current generator circuit to a first resistor which is coupled to a source terminal of said MOS device for supplying a first current to said gate of said MOS gate controlled device and thereby controlling the switching dv/dt of said circuit;

decoupling said current generator circuit from said first resistor and coupling said current generator circuit to a second resistor for supplying a second current to said gate and thereby controlling the switching di/dt of said circuit; and terminating the supply of said second current when said gate voltage reaches a predetermined value.

16. The method of claim 15, further comprising the step of detecting a negative value of the dv/dt prior to disconnecting said current generator from said first resistor.

17. The method of claim 15, further comprising the step of releasing a clamping circuit prior to coupling said current generator to said first resistor.

18. A method of controlling the switching di/dt and dv/dt of a MOS gate controlled device; said MOS gate controlled device controlling a supply voltage to a load circuit; said method comprising the steps of:

discharging a gate terminal of said MOS gate controlled device by coupling a common terminal of a current generator circuit to a first resistor which is coupled to a source terminal of said MOS gate controlled device and thereby controlling the rate of discharge;

decoupling said current generator circuit from said first resistor and coupling said current generator to a second resistor and thereby controlling said switching di/dt of said circuit; and clamping said gate terminal when the voltage at said gate terminal is below a predetermined value.

19. The method of claim 18, further comprising the step of measuring the value of the switching dv/dt prior to decoupling said current generator from said first resistor.

20. The method of claim 19, wherein said step of measuring the value of the dv/dt detects a negative value of the dv/dt.

21. A control circuit for controlling the switching di/dt and the switching dv/dt of a MOS gate controlled device formed in a substrate, said MOS gate controlled device providing a supply voltage to a load circuit; said control circuit comprising:

a current generator circuit having an output coupled to a gate terminal of said MOS gate controlled device for supplying a current thereto;

a calibrated wire bond having a predetermined length and diameter and coupled to one of a source terminal and a drain terminal of said MOS gate controlled device; and a feed back circuit for controlling the current supplied by said current generator circuit as a function of a value of the di/dt measured across said wire bond.

22. The method of claim 21 wherein the di/dt is measured by determining the voltage difference across the length of said calibrated wire bond.

* * * * *